(12) United States Patent
Murayama et al.

(10) Patent No.: US 6,838,401 B1
(45) Date of Patent: Jan. 4, 2005

(54) HEAT-RESISTANT FIBROUS PAPER

(75) Inventors: Sadamitsu Murayama, Osaka (JP); Michikage Matsui, Osaka (JP); Masanori Wada, Osaka (JP); Shigeru Ishihara, Ehime (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 10/343,605

(22) PCT Filed: Aug. 4, 2000

(86) PCT No.: PCT/JP00/05259

§ 371 (c)(1),
(2), (4) Date: Feb. 3, 2003

(87) PCT Pub. No.: WO02/12619

PCT Pub. Date: Feb. 14, 2002

(51) Int. Cl.$^7$ ............................ D02G 3/00; D21H 13/00
(52) U.S. Cl. .................... 442/335; 428/221; 428/292.1; 428/359; 428/395; 162/141; 162/157.1; 162/157.3; 162/203; 162/207; 442/336; 442/337; 442/409
(58) Field of Search ................................ 442/335, 336, 442/337, 409, 415; 162/141, 146, 149, 157.1, 157.3, 203, 207; 428/221, 292.1, 359, 395

(56) References Cited

U.S. PATENT DOCUMENTS

| | | | |
|---|---|---|---|
| 4,698,267 A | 10/1987 | Tokarsky | |
| 4,729,921 A | 3/1988 | Tokarsky | |
| 5,783,039 A | 7/1998 | Murayama | |
| 6,407,017 B1 * | 6/2002 | Wada et al. | 442/335 |

FOREIGN PATENT DOCUMENTS

| | | | | |
|---|---|---|---|---|
| EP | 0962559 | | 12/1999 | |
| EP | 994215 A1 | * | 4/2000 | .......... D21H/13/26 |
| EP | 1310593 A1 | * | 5/2003 | .......... D21H/13/26 |
| JP | 1-92233 A | | 4/1989 | |
| JP | 2-47392 A | | 2/1990 | |
| JP | 2-236907 A | | 9/1990 | |
| JP | 4-6708 A | | 1/1992 | |
| JP | 2000-54224 A | | 2/2000 | |

* cited by examiner

*Primary Examiner*—Rena Dye
*Assistant Examiner*—J. M. Gray
(74) *Attorney, Agent, or Firm*—Sughrue Mion, PLLC

(57) ABSTRACT

A heat-resistant fiber paper sheet which is formed from staple fibers made from a heat-resistant organic polymer, undrawn or low ratio drawn para-aromatic polyamide staple fibers, and an organic resin binder and/or fibrids comprising a heat-resistant organic polymer as main components, wherein the amount of said staple fibers is 45 to 97 percent by weight based on the total amount of said heat-resistant fiber paper sheet; the total amount of said organic resin binder and/or said fibrids is 3 to 55 percent by weight based on the total amount of said heat-resistant fiber paper sheet; and said organic resin binder is cured, and/or said undrawn or low ratio drawn para-aromatic polyamide staple fibers and said fibrids are partially softened, deformed and/or melted to exhibit the actions of binders. The obtained heat-resistant fiber paper sheet has excellent heat resistance, excellent heat dimensional stability, excellent plybond strength, an excellent electric insulating property in a high humidity, and the like, has good resin impregnability in spite of having a high bulk density, and is especially suitable for use as a substrate for electric insulating materials or as a substrate for laminates used for electric circuits.

33 Claims, No Drawings

HEAT-RESISTANT FIBROUS PAPER

TECHNICAL FIELD

The present invention relates to a heat-resistant fiber paper sheet which has excellent heat resistance and an excellent electric insulating property at high temperature and in high humidity and can suitably be used for laminates for electric circuits and to a method for producing the heat-resistant fiber paper sheet, and to a prepreg using the heat-resistant fiber paper sheet. In more detail, the present invention relates to the heat-resistant fiber paper sheet which is made from staple fibers comprising a heat-resistant organic polymer, undrawn or low ratio drawn para-aromatic polyamide staple fibers, and an organic resin binder and/or fibrids comprising a heat-resistant organic polymer as main components and to the method for producing the heat-resistant fiber paper sheet, and to a prepreg using the heat-resistant fiber paper sheet.

BACKGROUND ART

Various characteristics such as heat resistance, heat-resistant dimensional stability, moisture-resistant dimensional stability, electric insulating property, deformation resistance (hardly causing torsion, curvature, waving, or the like), and lightness are required for substrates used for laminates for electric circuits.

Since seat-resistant fiber paper sheets are excellent at points such as heat resistance, electric insulation, heat-resistant dimensional stability and lightness in comparison with those of other raw materials, the heat-resistant fiber paper sheets are recently being used for the substrates of laminates for electric circuits.

For example, a paper sheet [JP-A 2-236907 (hereunder, JP-A means "Japanese Unexamined Patent Publication"), JP-A 4-6708] comprising poly-meta-phenylene isophthalamide staple fibers ([CONEX®], produced by TEIJIN LTD.) and poly-meta-phenylene isophthalamide pulp, a heat-resistant fiber paper sheet (JP-A 1-92233, JP-A 2-47392) comprising copoly-para-phenylene.3,4'-oxydiphenylene.terephthalamide fibers ([TECHNORA®], produced by TEIJIN LTD.) and an organic resin binder, and the like, have been proposed.

However, the former not only shrinks when thermally treated at a high temperature of not less than 250° C., but is also especially inferior in an electrical insulating property in a high humidity, because having a large fiber equilibrium moisture content (water content) of 5 to 6% and a large impure ion content. Thereby, the former can not be used for electrical insulating substrates for which high reliability is required.

On the other hand, although having a small equilibrium moisture content and a small impure ion content, the latter has a problem that uniformity and reliability in the thickness direction of the paper sheet are deteriorated, because an organic resin used as a binder component is unevenly migrated on the front and back sides of the paper sheet in a process for making the paper sheet to reduce the content of the binder component in the middle layer portion of the paper sheet.

When such the heat-resistant fiber paper sheet is used as a substrate of a laminate for an electric circuit board, troubles have often occurred such as the breakage of the paper substrate, the mutual movement of the paper-forming staple fibers to deteriorate the uniformity of the fiber density distribution, and the deformation (torsion, curvature, waving or the like) of the laminate for the electric circuit board, for example, after the finish of a solder reflow process in which the fiber paper sheet is especially treated at a high temperature, because the expansion in the unevenness of the impregnation (especially in the thickness direction) and adhesion of a mixed varnish and the deterioration in adhesive forces between the fibers due to the partial melting of the binder resin are caused in a process for producing the laminate, especially in a process for making a prepreg by impregnating the heat-resistant fiber sheet with the mixed varnish such as an epoxy resin and then drying the impregnation product, a process for laminating and shaping the said prepreg, and the like. Thereby, the heat-resistant fiber paper sheet is not preferable.

Further, a paper sheet [JP-A 61-160500, JP-B (hereunder, JP-B means "Japanese Examined Patent Publication") 5-65640] has also been proposed in which para-aromatic polyamide staple fibers ([KEVLAR®D], produced by DU PONT LTD.) and fibrillated para-aromatic polyamide fine fibers ([KEVLAR®], produced by DU PONT LTD.) are mechanically bound to each other by the interlacing action of meta-aromatic polyamide fibrids used instead of the organic resin as the binder component.

This paper sheet has excellent characteristics such as excellent heat resistant, excellent heat-resistant dimensional stability, excellent moisture-resistant dimensional stability and excellent deformation resistance (hardly causing torsion, curvature, waving, or the like), but the binder component used in the paper sheet is only the fibrids. Therefore, in order to maintain a necessary tensile strength in each process for producing laminates for electric circuit boards, the addition amount of the fibrids must have been increased on the practical production. However, since the fibrids used as a binder component in the paper sheet and comprising the meta-aromatic polyamide have a high equilibrium moisture content and a large impure ion content, the paper sheet has had a problem that the paper sheet is very often judged to be defective in an electric insulation test carried out in a high humidity.

Namely, when a laminate used for an electric circuit board and formed using the substrate having a high percent of water absorption (equilibrium moisture content) in a large amount as a main material is energized in a high humidity for a long period, the contained impure ions are migrated to cause the failure of electric insulation. Therefore, the laminate can not maintain reliability for a long period.

Further, an aromatic polyamide fiber paper sheet (JP-A 9-228289) comprising staple fibers comprising a para-aromatic polyamide and staple fibers comprising a meta-aromatic polyamide has also been proposed, but since the meta-aromatic polyamide fibers are used, the paper sheet has a high percent of water absorption and a large impure ion content, and hence has a problem that the paper sheet is often judged to be defective in a substrate electric insulation test carried out at a high temperature, and a problem that an interlayer electric resistance value in the thickness direction of a printed circuit board is largely changed, when the absorption and desorption of moisture are repeated, as described above.

Although various kinds of the heat-resistant fiber paper sheets have been proposed as described above, a paper substrate has not been realized which has a low percent of water absorption, a low impure ion content, excellent electric insulation, excellent uniformity in the thickness of the paper sheet, good mixed varnish impermeability, excellent interlayer bondability, and excellent deformation resistance and is used for electrical insulating materials.

DISCLOSURE OF THE INVENTION

The object of the present invention is to provide a heat-resistant fiber paper sheet which has excellent heat resistance, excellent heat dimensional stability, excellent plybond strength, excellent electric insulation in a high humidity, and the like, has good resin permeability in spite of having a high bulk density, and is especially suitable as a substrate for electrical insulating materials and a substrate for laminates for electric circuits, to provide a prepreg using said heat-resistant fiber paper sheet, and to provide the laminate.

The inventors of the present invention have zealously examined to solve the problems of the conventional technologies as described above, and have consequently investigated that a desired heat-resistant fiber paper sheet is obtained by bonding one or more kinds of staple fibers comprising a heat-resistant polymer, such as staple fibers comprising presently commercially available general para-aromatic polyamide fibers, and undrawn or low ratio drawn para-aromatic polyamide staple fibers having a specific gravity of not more than 1.380 to each other with an organic resin binder and/or fibrids comprising a heat-resistant organic polymer, which exhibit a binding performance at a paper-making stage, and then treating the made paper sheet at a high temperature under a high pressure to cure said organic resin binder, and/or partially soften and/or melt the fibrids comprising said heat-resistant organic polymer, and/or the staple fibers comprising said undrawn or low ratio drawn para-aromatic polyamide staple fibers, thus strongly binding the single filaments forming the paper sheet to each other.

Namely, according to the present invention, there are provided a heat-resistant fiber paper sheet which is formed from staple fibers comprising a heat-resistant organic polymer, undrawn or low ratio drawn para-aromatic polyamide staple fibers having a specific gravity of not more than 1.380, and an organic resin binder and/or fibrids comprising a heat-resistant organic polymer as main components, characterized in that the amount of said staple fibers is 45 to 97 percent by weight based on the total amount of said heat-resistant fiber paper sheet, the amount of said organic resin binder and/or said fibrids is 3 to 55 percent by weight based on the total amount of said heat-resistant fiber paper sheet, and said organic resin binder is cured, and/or the fibrids comprising said organic polymer, and/or the staple fibers comprising said para-aromatic polyamide are partially softened and/or melted to exhibit the actions of binders;

a method for producing a heat-resistant fiber paper sheet, characterized by subjecting staple fibers comprising a heat-resistant organic polymer, undrawn or low ratio drawn para-aromatic polyamide staple fibers having a specific gravity of not more than 1.380, and an organic resin binder and/or fibrids comprising a heat-resistant organic polymer to a wet paper-making process, drying the obtained wet paper sheet, and then heating and pressurizing the obtained dry paper sheet at a temperature of 220 to 400° C. at a pressure of 150 to 250 kg/cm to partially soften and/or melt the fibrids comprising said heat-resistant organic polymer and/or said undrawn or low ratio drawn aromatic polyamide staple fibers; a prepreg formed by impregnating the above-described heat-resistant fiber paper sheet with a thermosetting resin; and a laminate formed by laminating said prepregs.

BEST MODE FOR CARRYING OUT THE INVENTION

The heat-resistant fiber paper sheet of the present invention includes a paper-like article, a nonwoven fabric-like article or a sheet-like article which is formed from staple fibers comprising from a heat-resistant organic polymer, undrawn or low ratio drawn para-aromatic polyamide staple fibers having a specific gravity of not more than 1.380, and an organic resin binder and/or fibrids comprising a heat-resistant organic polymer as main components, wherein said organic resin binder is cured, and/or the fibrids comprising said heat-resistant organic polymer, and/or the staple fibers comprising said para-aromatic polyamide are partially softened and/or melted to exhibit the actions of binders.

The above-described staple fibers comprising the heat-resistant organic polymer include staple fibers comprising an aromatic polyamide, a heterogeneous ring-containing aromatic polymer or a polyether ether ketone, which has a fiber-forming ability and a thermal decomposition-initiating temperature of not less than 330° C. The staple fibers of the aromatic polyamide are especially preferably used. One kind of the above-described staple fibers may singly be used, or two or more kinds of the staple fibers may be blended and then used.

Further, said aromatic polyamide staple fibers are staple fibers comprising an aromatic homopolyamide or aromatic copolyamide in which not less than 80 percent by mole, preferably not less than 90 percent by mole, of repeating units forming the polyamide are represented by the following formula (I).

Therein, $Ar_1$ and $Ar_2$ represent aromatic groups, respectively, especially preferably the same aromatic groups or mutually different aromatic groups selected from the following formulas (II), provided that the hydrogen atoms of the aromatic groups may be replaced by halogen atoms, lower alkyl groups each having one to three carbon atoms, phenyl groups or the like.

$$—NH—Ar_1—NHCO—Ar_2—CO— \quad (I)$$

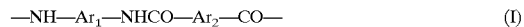

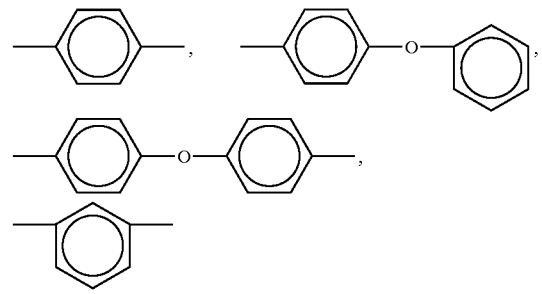

(II)

Methods for producing such the aromatic polyamide fibers and the characteristics of the fibers are described, for example, in British Patent No. 1501948 publication, U.S. Pat. Nos. 3,733,964, 3,767,756, 3,869,429 publications, JP-A 49-100322, JP-A 47-10863, JP-A 58-144152, JP-A 4-65513, and the like.

Para-aromatic polyamide staple fibers are especially preferable among the aromatic polyamide fibers used in the present invention. The para-aromatic polyamide staple fibers are staple fibers in which not less than 50 percent by mole of the above-described $Ar_1$ and $Ar_2$ are para-aromatic groups. Concretely, poly-para-phenylene terephthalamide staple fibers ([KEVLAR®], produced by DU PONT LTD.) and copoly-para-phenylene.3,4'-oxydiphenylene.terephthalamide staple fibers ([TECHNORA®], produced by TEIJIN LTD.) are included, and the latter is especially preferable, because the content of impure ions caused by a solvent used on the production of the fibers is small and the latter thereby has an excellent electrical insulating property.

Further, staple fibers obtained by fixing a solid inorganic compound having a cation-converting property and an ion-non-absorbing property to the surfaces of the above-described copoly-para-phenylene.3,4'-oxydiphenylene.terephthalamide staple fibers are a preferable mode, because the obtained staple fibers improve the impregnation of a mixed varnish in a process for producing laminates for electric circuit boards, especially a process for the impregnation of the mixed varnish such as an epoxy resin, further improve adhesivity to the mixed varnish through said inorganic compound, and thereby have an effect for reducing the quantity of deformation (the quantity of torsion, curvature or waving) in a process for producing the laminates for the electric circuit boards, and an effect for improving electric insulation, dimensional stability and the like in high humidity.

Herein, the above-described cation-converting and ion-non-absorbing inorganic compound is a compound having a cation-converting ability and an ion-non-adsorbing ability, and concretely includes silica.alumina, silica.magnesia, kaolin, acid white clay, activated clay, talc, bentonite, and osmos.

These compounds are preferable, because an adhesion effect is further improved, when the compounds are especially fixed to the surfaces of the fibers as solid particles, and the sizes (particle diameters) of said particles are about 0.01 to 5.00 $\mu$m. The adhesion of the inorganic compound to the surfaces of the fibers is carried out, for example, by pressing said inorganic compound particles to the softened or melted surfaces of the fibers to thrust the particles into the ultra-surface layer portions of the fibers.

One part, such as the terminal portion, of the para-aromatic polyamide staple fibers may be fibrillated, but when the rate of the fibrillation is too large, the excessive fibrillation is not preferable, because of causing problems such as the heterogeneous impregnation of the mixed varnish and the deterioration in the smoothness of the surfaces.

Next, a para-aromatic polyamide is preferably used for the undrawn or low ratio drawn aromatic polyamide fibers having a specific gravity of not more than 1.380 and used in the present invention. The fibers are now usually commercially not available, preferably have a breaking elongation of not less than 5.3% (high elongation), and a tenacity of not more than 17.5 g/denier (low tenacity), more preferably a breaking elongation of not less than 6.0% and a tenacity of not more than 16.5 g/denier, and further preferably have a specific gravity of not more than 1.375.

Such the para-aromatic polyamide fibers are obtained, for example, by utilizing non-drawn fibers (undrawn fibers) or contriving production conditions, such as the reduction of a drawing ratio (for example, low ratio drawn fibers drawn at a draw ratio of not more than 3 or at a draw ratio of 30 to 40% based on the maximum drawable ratio) or the reduction of heat history, in a process for producing the above-described copoly-para-phenylene.3,4'-oxydiphenylene.terephthalamide staple fibers.

Such the para-aromatic polyamide fibers usually have characteristics largely different from those of said commercially available copoly-para-phenylene.3,4'-oxydiphenylene.terephthalamide staple fibers, namely, a breaking elongation of not less than 5.3% (high elongation), a tenacity of not more than 17.5 g/denier (low tenacity), and a specific gravity of not more than 1.380 (low specific gravity). The para-aromatic polyamide fibers having such the characteristics are easily softened, deformed, melted (including a semi-melted state) or cut under heated and pressurized conditions in spite of having the same composition as that of the commercially available fibers, have a lower water-absorbing property than that of meta-aromatic polyamide fibers, and therefore enable the production of the paper sheet utilizing the characteristics. When having the specific gravity exceeding 1.380, the para-aromatic polyamide fibers are hardly softened, deformed or melted under the heated and pressurized conditions, whereby the production of the paper sheet utilizing the characteristics is difficult.

Namely, a paper sheet made by mixing other aromatic polyamide staple fibers with a small amount of the para-aromatic polyamide staple fibers having the special performances that the fibers are easily deformed, softened, melted or cut under such the heated and pressurized conditions, and then subjecting the mixture to a wet paper-making process has an effect that, when heated and pressurized in a calendering process or the like, said fibers are softened, deformed, partially melted or partially cut to enhance interlacement, adhesion and adhered area with and to the other aromatic polyamide staple fibers, thereby improving fixing degrees and adhering degrees between the single fibers and further improving the tensile strength and plybond strength of the made paper sheet, and can thereby be used as an effective suitable substrate for reducing deformation in a process for producing an electric material using said paper sheet, laminates using said paper sheet and used for electric circuits, or the like.

Also in this case, as described above, the fixation of the solid, cation-converting and ion-non-adsorbing inorganic compound to the surfaces of said undrawn or low ratio drawn para-aromatic polyamide fibers having a specific gravity of not more than 1.380 is more preferable, because of showing the good impregnability of said mixed varnish in a process for the impregnation of the mixed varnish such as an epoxy resin, further expressing improved adhesivity to the mixed varnish through the inorganic compound, and therefore exhibiting an effect for reducing deformation in a process for producing laminates for electric circuit boards and an effect for improving electric insulation, dimensional stability and the like in high humidity. Further, such the undrawn or low ratio drawn para-aromatic polyamide fibers are a suitable material for substrates for electric materials for which good electric insulation, especially good electric insulation reliability in high humidity, is required over a long period, or for the substrates of laminates for electric circuit boards, for which good dimensional stability under various environmental atmospheres is desired, because the undrawn or low ratio drawn para-aromatic polyamide fibers have a remarkably smaller impure ion content, a highly smaller percent of water absorption, and a smaller dimensional change accompanied by the absorption and desorption of moisture, than those of meta-aromatic polyamide fibers.

In this invention, it is preferable that said undrawn or low ratio drawn para-aromatic polyamide fibers having a specific gravity of not more than 1.380 and the aromatic polyamide staple fibers except said para-aromatic polyamide staple fibers are blended each other in ranges of 4 to 35 percent by weight and 65 to 96 percent by weight, respectively, based on the total weight of the aromatic polyamide fibers.

Further, among commercially available general para-aromatic polyamide fibers are included the fibers showing a tendency to extend in the axial direction of the fibers, when the fibers are subjected to a dehydration (dehumidification) treatment for removing water (moisture) contained in the fibers by a heating method or the like, and further among the undrawn or low ratio drawn para-aromatic polyamide fibers having a specific gravity of not more than 1.380 are included the fibers showing a tendency to inversely shrink in the axial direction of the fibers. Therefore, when both the kinds of the fibers are well combined with each other, heat-resistant fiber paper sheet which hardly causes dimensional change even when subjected to repeated moisture absorption, dryness and dehumidification treatments, and has excellent heat-resistant dimensional stability and excellent moisture-resistant dimensional stability can be obtained. In particular, the undrawn or low ratio drawn para-aromatic polyamide staple fibers having a specific gravity of not more than 1.380 and used in the present invention have a smaller equilibrium moisture content and a smaller impure ion content than those of meta-aromatic polyamide staple fibers, and the dimensional change of the undrawn or low ratio drawn para-aromatic polyamide staple fibers in the fiber direction under the same treatment conditions as described above is caused in the direction just opposite to that of general para-aromatic polyamide staple fibers in an only slightly larger extent than the same extent. Therefore, the heat-resistant fiber paper sheet which can easily wholly be balanced and has excellent dimensional stability can readily be designed.

The above-described undrawn or low ratio drawn para-aromatic polyamide staple fibers having a specific gravity of not more than 1.380 are mixed in an amount of preferably at least 4 percent by weight, more preferably not less than 8 percent by weight, based on the total weight of the paper sheet. However, since said undrawn or low ratio drawn para-aromatic polyamide staple fibers having a specific gravity of not more than 1.380 have a higher equilibrium moisture content (water content) than that of commercially available general para-aromatic polyamide staple fiber, the electric insulation, especially the electric insulation at high temperature and in high humidity, of the obtained paper sheet may be deteriorated, thereby making it impossible that the paper sheet is used for the substrates of laminates for electric circuit boards needing high reliability for a long period, when the undrawn or low ratio drawn para-aromatic polyamide staple fibers are mixed in a too large amount. Hence, said mixing amount is at most 35 percent by weight, preferably not more than 20 percent by weight. The undrawn or low ratio drawn para-aromatic polyamide staple fibers having a specific gravity of not more than 1.380 have an advantage that the staple fibers exhibit the same or higher performances as or than those of the meta-aromatic polyamide staple fibers exhibiting the similar effects in a slightly smaller mixing ratio than that of the meta-aromatic polyamide staple fibers, and further has an advantage from the viewpoints of the low water absorption and the low impure ion content which are free from said meta-aromatic polyamide staple fibers. However, the lowering of heat resistance is somewhat worried. Hence, it is preferable that the undrawn or low ratio drawn para-aromatic polyamide staple fibers having a specific gravity of not more than 1.380 is mixed and used within the above-described range in response to an objective use.

The heat-resistant organic polymer staple fibers except the aromatic polyamide staple fibers include staple fibers comprising a heterogeneous ring-containing aromatic polymer such as poly-para-phenylenebenzobisthiazole or poly-para-phenylenebenzobisoxazole, or staple fibers comprising a polyester ether ketone.

Thus, by adjusting the kinds and mixing ratio of the used staple fibers comprising the heat-resistant organic polymers, the rate of heat dimensional change after a heat treatment at a temperature of 280° C. for 5 min can be controlled to not more than 0.3%, preferably not more than 0.2%, and when measured by the below-described method, the maximum quantity of the dimensional change of the heat-resistant fiber paper sheet due to the absorption and desorption of moisture can be controlled to not more than 65 $\mu$m, preferably not more than 55 $\mu$m, more preferably not more than 40 $\mu$m. Such the paper sheet can be used to produce electric insulating materials or laminates for electric circuit boards, which have remarkably excellent deformation resistance (phenomena such as torsion, curvature and waving), heat-resistant dimensional stability and moisture-resistant dimensional stability.

Herein, the quantity of the dimensional change due to the moisture absorption and desorption of the heat-resistant fiber paper sheet is measured by the following method. Namely, the heat-resistant fiber paper sheet (length=20 mm, width=5 mm) left in an atmosphere having not less than 85% RH at ordinary temperature for not less than 48 hours to sufficiently absorb moisture is heated from the ordinary temperature to 280° C. at a temperature-rising rate of 10° C./min and then immediately cooled to the ordinary temperature at a temperature-lowering rate of 10° C./min to dry the fiber paper sheet. The heating treatment from the ordinary temperature to 280° C. and the cooling treatment to the ordinary temperature are further twice repeated. Subsequently, the maximum quantity of dimensional change (the maximum quantity of elongation or the maximum quantity of shrinkage) of said paper sheet in the longitudinal direction is measured.

The single fiber fineness of the above-described staple fibers comprising the heat-resistant organic polymer is preferably ranged from 0.1 to 10 denier, more preferably from 0.3 to 5.0 denier. The staple fibers having a single fiber fineness of less than 0.1 denier are not preferable, because of having many difficult points on the technology for producing the fibers, causing fiber breakages and fuzzes to make it impossible to produce the fibers having a good quality, and further enhancing the cost. On the other hand, the staple fibers having a single fiber fineness of >10 denier are not practical, because the mechanical properties, especially tenacity, of the fibers are largely deteriorated.

Further, the fiber length of the staple fibers comprising the heat-resistant polymer is 0.5 to 80 mm, preferably 1 to 60 mm. When a paper sheet is formed by a wet paper-making method, the fiber length of the staple fibers is preferably 2 to 12 mm, more preferably 2.5 to 6 mm. When said fiber length is less than 0.5 mm, the mechanical physical properties of the obtained aromatic fiber paper sheet as a fiber aggregate is liable to be insufficient. On the other hand, the fiber length exceeding 80 mm is not preferable, because of deteriorating the openability, dispersibility, or the like, of the staple fibers, damaging the uniformity of the obtained fiber aggregate, and giving insufficient mechanical properties.

Further, as described above, when the staple fibers comprising two or more kinds of the heat-resistant organic polymers are mixed with each other, the fiber lengths of the staple fibers may be identical, but it is preferable that said fiber lengths are different from each other by a difference of not less than 0.6 mm, preferably not less than 1.0 mm. The reason is that in the case where the fiber lengths of the staple fibers are different form each other, contact points between both the kinds of the single fibers in the paper sheet are increased, and the heat dimensional stability of the paper sheet in the paper sheet thickness direction is especially improved, in comparison with the case where both the fiber lengths of the staple fibers are identical. In particular, when the undrawn or low ratio drawn para-aromatic polyamide staple fibers are mixed with aromatic polyamide fibers except said para-aromatic polyamide staple fibers, this effect remarkably appears. The reason is that since having a high elongation, a low tenacity, a low crystallinity, and a low specific gravity, said undrawn or low ratio drawn para-aromatic polyamide staple fibers having a specific gravity of not more than 1.380 are, if necessary, well drawn, deformed or cut around the aromatic polyamide staple fibers except said undrawn or low ratio drawn para-aromatic polyamide staple fibers in a heating and pressurizing process such as a calendaring process to effectively adhere or bind the single fibers to each other.

Next, the organic resin binder used in the present invention includes thermosetting organic resins such as epoxy resins, phenolic resins, polyurethane resins, and melamine resins. In particular, a water-dispersible epoxy-based resin having epoxy functional groups in the molecule is suitable, because of having good compatibility with a mixed varnish impregnated in a process for producing a prepreg.

Additionally, the fibrids comprising the organic polymer and used in the present invention preferably have an equilibrium moisture content of not more than 7.5%, are a general name for finely fibrillated thin leaf- or scaly small pieces or randomly fibrillated fine staple fibers which exhibit a binder performance in a wet paper-making process, and include fibrids produced by mixing an organic polymer solution in a system in which a precipitating agent for said polymer solution and a shear force exist, as described in JP-B 35-11851, JP-B 37-5732, and the like, and fibrids produced by randomly fibriliating a formed article produced from a polymer solution exhibiting optical anisotropy and having a molecular orientation property with a mechanical shear force such as a beating force, as described in JP-B 59-603. In particular, the fibrids produced by the former method is most suitable.

Any one of heat-resistant polymers having fiber or film-forming abilities and having thermal decomposition-initiating temperatures of not less than 310° C. can be used as the organic polymer for forming such the fibrids.

For example, aromatic polyamides, melt liquid crystalline wholly aromatic polyesters, heterogeneous ring-containing aromatic polymers, and the like may be used. Among the polymers, copoly-para-phenylene.3,4'-oxydiphenylene.terephthalamide (TECHNORA®, produced by TEJIN LTD.) having a small impure ion content, a melt liquid crystalline wholly aromatic polyester (VECTRAN®, produced by KURARAY LTD.) comprising a copolymer of p-hydroxybenzoic acid with 2,6-hydroxynaphthoic acid and having a small equilibrium moisture content are especially preferably used, and, when heat resistance is required, the above-described poly-para-phenylenebenzbisoxazole (PBOO, produced by TOYO BOSEKI LTD.) is preferably used.

The rate of the fibrids comprising the above-described organic polymer in the heat-resistant fiber paper sheet is ranged from 3 to 55 percent by weight, preferably 4 to 45 percent by weight, more preferably 5 to 30 percent by weight. When the mixing rate of said fibrids is set to a relative low value, it is preferable to use fibrids obtained by a production method described in JP-B 35-11851, JP-B 37-5732, and the like, and when the mixing rate is set to a relatively high value, it is preferable to use fibrids produced by a method described in JP-B 59-603. Further, a mixture of the fibrids obtained by both the production methods may be used.

When the mixing rate of the above-described fibrids is less than 3%, a tensile strength necessary for forming the paper sheet in a wet paper-making process can not be kept, while when the mixing rate exceeds 55 percent by weight, the bulk density of the obtained heat-resistant fiber paper sheet is too large to inhibit the impregnation of a wixed varnish.

Further, similarly to the case of the above-described staple fibers, since the fibrids comprising the organic polymer include fibrids which shrink or extend, when water (moisture) contained in the fibrids is removed (dehumidified), both the kinds of the fibrids are well combined with each other to obtain the heat-resistant fiber paper sheet whose size is hardly changed, even when repeatedly subjected to a water-washing treatment and a drying treatment, and which has excellent heat-resistant dimensional stability and moisture-resistant dimensional stability. Therefore, two or more kinds of the fibrids may be mixed and used.

In addition, the fibrids comprising the above-described organic polymer have a function as a binder for binding the staple fibers to each other, but the binding force (adhesive force) of the fibrids is inferior to those of thermosetting resins, such as epoxy resins, phenolic resins, polyurethane resins or melamine resins. Therefore, a small amount of a water dispersion type binder comprising the thermosetting resin may be added to enhance a paper-making performance in a wet paper-making process, and, if necessary, all of the fibrids may be replaced by the above-described organic binder. Especially, as described above, the water-dispersible epoxy-based resin having epoxy functional groups in the molecule has good compatibility with a mixed varnish used in a prepreg process and is hence optimal as the binder.

The rate of said binder (organic resin binder) in the aromatic fiber paper sheet of the present invention is not more than one second, preferably not more than one third, more preferably not more than one fourth, of the weight of the fibrids comprising the above-described organic polymer. When the rate of said binder exceeds one second of the weight of said fibrids, the fibrids are liable to be not able to control the migration of the resin in a wet paper-making process. Consequently, the interlayer binding forces between the front and back side portions and middle layer portion of the paper sheet become heterogeneous, and the orientation of the single fibers and the uniformity of the fiber density distribution in the middle layer portion of the paper sheet is often deteriorated in a calendering process. However, in response to uses, there is a case where it is preferable that the volumes of spaces in the middle layer portion of the paper sheet are enlarged to increase the amount of the mixed varnish impregnated in the middle layer portion of the paper sheet. In the case, all of the fibrids may be replaced by the above-described organic binder resin. The heat-resistant fiber paper sheet of the present invention may be mixed with, for example, glass fibers or ceramic fibers within a range not separating from the object of the present invention.

Generally, in a laminate for an electric circuit board, the characteristics, such as heat-resistant dimensional stability, moisture-resistant dimensional stability and deformation stability (phenomena such as torsion, curvature and waving), of the substrate of the laminate are important quality items, and the characteristics are affected by the values, such as bulk density, tensile strength and plybond strength, of a paper sheet used as the substrate for the laminate.

Accordingly, it is preferable that the heat-resistant fiber paper sheet of the present invention has its bulk density in a range of from 0.45 to 1.13 g/cm$^3$, preferably from 0.50 to 0.88 g/cm$^3$, more preferably from 0.55 to 0.75 g/cm$^3$. When said bulk density is less than 0.45 g/cm$^3$, the binding forces between the staple fibers in the middle layer portion of the paper sheet are deteriorated to cause the excessive impregnation of the paper sheet with the mixed varnish. Therefore, the partial movements of the single fibers due to the flow of the impregnated varnish, the density unevenness of the fibers in the obtained laminate for the electric circuit board, and the deterioration of heat-resistant dimensional stability and deformation resistance are often caused in a process for producing a prepreg and in a process for producing the laminate for the electric circuit board, especially in a process for pressing the laminate.

On the other hand, when said bulk density exceeds 1.13 g/Cm$^3$, the paper sheet is often scarcely impregnated with the mixed varnish to give a laminate which is used for an electric circuit board and has deteriorated electric insulation, heat-resistant dimensional stability and deformation resistance. Thereby, the too large bulk density is not preferable.

Additionally, the tensile strength of the heat-resistant fiber paper sheet of the present invention is not less than 1.5 kg/15 mm, preferably not less than 2.5 kg/15 mm, more preferably not less than 3.5 kg/15 mm, and the plybond strength of the heat-resistant fiber paper sheet is not less than 12 g/15 mm, preferably not less than 15 g/15 mm, more preferably 20 g/15 mm.

When said plybond strength is less than 12 g/15 mm, the binding forces between the single fibers in the middle layer portion of the paper sheet are deteriorated to cause the excessive impregnation of the paper sheet with the mixed varnish. Therefore, the partial movements of the single fibers due to the flow of the impregnated varnish, the density unevenness of the fibers in the obtained laminate for the electric circuit board, and the deterioration of heat-resistant dimensional stability and deformation resistance are often caused in a process for producing the prepreg and in a process for producing the laminate for the electric circuit board, especially in a process for pressing the laminate. Further, when the tensile strength of the paper sheet is less than 15 k g/15 mm, the paper sheet is liable to be broken in the process for impregnating the paper sheet with the mixed varnish. Therefore, the small tensile strength of the paper sheet is not preferable.

Such the heat-resistant fiber paper sheet can be made by known methods, for example, by a method comprising weighing and mixing the staple fibers comprising the heat-resistant organic polymer, the staple fibers comprising undrawn or low ratio drawn para-aromatic polyamide and having a specific gravity of not more than 1.380, the organic resin binder and/or the fibrids comprising the heat-resistant organic polymer in a prescribed ratio, charging and homogeneously dispersing the mixture in water so that the concentration of the mixture of said staple fibers with the fibrids is about 0.15 to 0.35 percent by weight, if necessary, adding a dispersant and a viscosity-controlling agent to the prepared aqueous slurry, making the wet paper sheet from the slurry by a wet paper-making method using a paper machine such as a short net type paper machine or a circular net type paper machine, if necessary, imparting an organic binder resin to the made wet paper sheet by a method such as a spray, shower, roller pick-up or dipping method, drying the wet paper sheet, heating and pressuring the dried paper sheet to give the above-described bulk density, thus partially curing the organic resin binder and/or partially softening and/or melting the fibrids comprising said organic polymer and/or the undrawn or low ratio drawn aromatic polyamide staple fibers having a specific gravity of not more than 1.380.

When carried out using a calendering machine, the above-described heating pressurization is carried out between a hard surface roll having a diameter of about 15 to 80 cm and a surface-deformable elastic roll having a diameter of about 30 to 100 cm, preferably between two hard surface rolls each having a diameter of about 20 to 80 cm. Therein, the paper sheet is heated in a temperature range of preferably from 220 to 400° C., more preferably from 250 to 350° C., furthermore preferably from 280 to 330° C., to further cure the organic resin binder partially cured by the drying or the like, and/or soften and/or partially melt the fibrids comprising the heat-resistant organic polymer and/or the undrawn or low ratio drawn aromatic polyamide staple fibers having a specific gravity of not more than 1.380, thus making to sufficiently exhibit functions as the binders.

Additionally, it is preferable that the pressurization is carried out preferably at a linear pressure of 150 to 250 kg/cm, more preferably at a linear pressure of 180 to 250 kg/cm. The above-described calendaring processing may be performed by an one step treatment method, but is preferably performed by a two step treatment method including a preliminarily heating and pressuring treatment, in order to obtain the paper sheet which is more uniform in the thick direction.

When these heating and pressurizing conditions are beyond the above-described temperature range or the above-described pressure range, the organic resin binder can sufficiently not exhibit the performance, or the fibrids comprising the heat-resistant organic polymer and/or the undrawn or low ratio drawn aromatic polyamide staple fibers having a specific gravity of not more than 1.380 can sufficiently not exhibit the functions as the binders. Consequently, the bulk density of the obtained heat-resistant paper sheet may be less than 0.45 g/cm$^3$ or more than 1.13 g/cm$^3$, or the tensile strength and plybond strength of the obtained aromatic fiber paper sheet may be less than 1.5 kg/15 mm and less than 12 g/15 mm, respectively.

Further, the heat-resistant fiber paper sheet obtained by the heating and pressurizing treatment under the above-described conditions has a rate of heat dimensional change of not more than 0.30% after a heat treatment at a temperature of 280° C. for five minutes, excellent heat-resistant dimensional stability and a low equilibrium moisture content, and can thereby suitably be used for a laminate for an electric circuit board.

The thus obtained heat-resistant fiber paper sheet of the present invention has a low bulk density, a high tensile strength, a high plybond strength, a small percent of water absorption, small dimensional changes against heat, temperature and moisture in the thickness and face directions of the paper sheet, and good impregnability with the mixed varnish and the like, due to the decrease in the breakage of paper substrates in a resin impregnation process and the like, because the undrawn or low ratio drawn aromatic polyamide staple fibers having a specific gravity of not more than 1.380, the fibrids comprising the heat-resistant organic polymer, and/or the organic resin binder exhibit the actions of the binders, and is scarcely deformed in a process for producing an electric material, a process for producing a laminate for an electric circuit board, and the like, because the partial movements of the staple fibers are prevented in a press lamination process, thereby enabling the production of the flat and uniform laminate.

Namely, in the heat-resistant fiber paper sheet of the present invention, (1). Since the undrawn or low ratio drawn aromatic polyamide staple fibers having a specific gravity of not more than 1.380 and having a low moisture content is used as a part of the binders, the migration phenomenon of the organic resin binder in a drying process on the making of the paper sheet is controlled, and the uneven distribution of the resin binder is reduced to improve the uniformity of the paper sheet in the thickness direction of the paper sheet.

(2). When the dry paper sheet is calendered to bind the staple fibers approximately homogeneously dispersed in the paper sheet so as to give the prescribed bull density, said single fibers are easily fixed or adhered to each other, and the organic resin binder is cured to control the mutual movement of the single fibers in the paper sheet and prevent the disorder of the arrangement of the staple fibers, because the undrawn or low ratio drawn para-aromatic polyamide staple fibers having a specific gravity of not more than 1.380 and the fibrids comprising the heat-resistant organic polymer are partially softened, deformed and/or melted.

(3). By a synergistic effect between good resin impregnability and low filled states among the single filaments due to the employment of the fibrids, the density and arrangement of the single fibers in the cross-sectional direction and face direction of the paper sheet are uniformize to prevent the heat dimensional change and deformation of the paper sheet.

EXAMPLES

The present invention will concretely be explained hereafter with examples, but the present invention is not limited to the examples. Methods for measuring physical properties, used in the examples are as follows.

(1). Bulk Density:

The bulk density was measured by a method based on JIS C-2111 6.1.

(2). Tensile Strength:

The tensile strength was measured by a method based on JIS C2111 7 with a constant speed elongation type tensile testing machine.

(3). Specific Gravity:

The specific gravity was determined by a density gradient pipe method (N-heptane/carbon tetrachloride, 25° C.).

(4). Plybond Strength

The strength (g/15 mm) on the peeling of the middle layer portion of a sample having a length of 200 mm and a width of 15 mm in a T-shape was measured using a constant speed elongation type tensile testing machine.

(5). Rate of Heat Dimensional Change

The lengths of a sample having a length of 300 mm and a width of 50 mm were measured using a highly precision two-dimensional coordinate measuring machine (manufactured by MUTOU IND. LTD.) before a heat treatment and after the heat treatment at 280° C. for five minutes, and the rates of heat dimensional change were then calculated by the following calculating formula. The samples for the measurement were collected from continuous paper sheet in the longitudinal direction and in the lateral direction and measured. The average values of the measurement results were compared and judged.

Rate (%) of heat dimensional change=100×{(length before the heat treatment−length after the heat treatment)/length before the heat treatment}

(6). Equilibrium Moisture Content

Each of the equilibrium moisture contents of the staple fibers, the fibrids and the fiber paper sheet was obtained by absolutely drying a sample in an atmosphere of 120° C., leaving the sample at a temperature of 20° C. and in a relative humidity of 65% RH for 72 hours, determining a moisture content in said sample, calculating a ratio of the determined moisture content to the weight of said sample in an absolutely dried state, and representing the calculation result by percent (%), on the basis of JIS L-1013.

When a sample contains two or more kinds of staple fibers or fibrids, the equilibrium moisture content was obtained by independently measuring the equilibrium moisture contents of the constituents, respectively, and representing the measurement results as a weight-average value according to the mixed ratio.

(7). Evaluation of Dimensional Stability to Temperature and Humidity (Absorption or Desorption of Moisture):

A thermal analysis device [TMA; thermoflex type, manufactured by RIGAKU DENKI LTD.] was used, and the measurement was carried out at an initial sample distance of 200 mm between chucks in a width of 5 mm and at a temperature-rising or lowering rate of 10° C./min. A sample left in an atmosphere having a relative humidity of not less than 85% RH at the ordinary temperature for not less than 48 hours to sufficiently absorb moisture was used as the sample for the measurement. The comparative judgment of the dimensional stability to the temperature and the humidity was carried out by drawing the dimensional change locus of the above-described sample, when the sample was repeatedly subjected to temperature-rising treatments and temperature-lowering treatments within a range of the ordinary temperature to 280° C., comparing and observing the dimensional change locus of the sample, when the sample was subjected to the first temperature-rising treatment and the first temperature-lowering treatment or when the sample was subjected to the subsequent temperature-rising treatment and the subsequent temperature-lowering treatment, measuring the maximum divergence quantity (maximum change quantity=maximum extension quantity or maximum shrinkage quantity) of the dimensional change locus before or after the temperature-rising and lowering operations or during the temperature-rising and lowering operations, and then judging the suitability of the sample on the basis of the extent of the maximum divergence quantity. Namely, it was judged that the smaller the divergence quantity of the dimensional change locus in the temperature-rising operation and in the temperature-lowering operation was, the more stable the sample was to the changes of the temperature and the humidity and the more excellent the heat-resistant dimensional stability and the deformation resistance of the sample were.

(8). Change Quantity of Laminate

An epoxy resin composition comprising a highly pure brominated bisphenol A type epoxy resin, an ortho-cresol novolak type epoxy resin, dicyandiamide as a curing agent, and 2-ethyl-4-methylimidazole as a curing accelerator was dissolved in a mixture solvent of methyl ethyl ketone with methylcellosolve. A heat-resistant fiber paper sheet was impregnated with the obtained mixed varnish and then dried at a temperature of 110 to 120° C. for 5 to 10 minutes to make the B stage prepreg paper sheet having a resin volume content of 55%. Two of said prepreg paper sheets were laminated to both the sides of a 18 μm-thick copper foil, and the same copper foils were further laminated to the outsides of the obtained laminate and then subjected to a hot press treatment in the conditions of 170° C.×40 kg/cm×50 minutes under reduced pressure to cure the resin. The obtained laminate for an electric circuit board was further subjected to a post-curing treatment in a hot air drying machine at a temperature of 200° C. for about 20 minutes.

The laminate for the electric circuit board was cut to form a 150 mm square laminate piece. The formed laminated piece was etched to remove the copper foils in the 110 mm square central portions of both the sides, while leaving the copper foils on both the sides in widths of 20 mm from the edges of the laminate piece in a frame form, thus forming the sample for the evaluation.

The partially etched laminate for the electric circuit board was thermally treated at a temperature of 260° C. for 10 minutes, and the maximum deformation quantity (curvature quantity, or lift quantity due to torsion or waving) where the central portion was a starting point was measured to determine the deformation quantity.

(9). Insulative Resistance Value of Laminate

The laminate formed in the above-described (8), used for the electric circuit board, and not subjected to the etching of the copper foils was used. A comb type electrode pattern having electrodes at a distance of 0.15 mm was formed on one side of the laminate by an etching method, and the laminate was kept for 1,000 hours in an atmosphere of 60° C. and 95% RH, while a direct current voltage of 35V was applied between the comb type electrodes. Subsequently, said comb type electrodes are kept in an atmosphere of 20° C. and 60% RH for one hour, and a direct current electric voltage (35 to 90V) was then applied between the comb type electrodes for 60 seconds to measure the insulative resistance value.

Example 1

83 Percent by weight of staple fibers ([TECHNORA®], produced by TEIJIN LTD.) comprising copoly-para-phenylene.3,4'-oxydiphenylene.terephthalamide, produced by fixing 0.5 percent by weight of talc and 0.1 percent by weight of osmos to the surfaces of the staple fibers of the copoly-para-phenylene.3,4'-oxydiphenylene.terephthalamide, and having a breaking elongation of 4.6%, a breaking tenacity of 29.4 g/denier, a specific gravity of 1.398, a single fiber fineness of 1.5 denier, a fiber length of 3 mm, and an equilibrium water content of 1.8% as staple fibers comprising a heat-resistant organic polymer, 12 percent by weight of staple fibers ([TECHNORA®], produced by TEIJIN LTD., draw ratio: 1.2) comprising copoly-para-phenylene.3,4'-oxydiphenylene.terephthalamide, produced by fixing 0.6 percent by weight of talc and 0.2 percent by weight of osmos to the surfaces of the staple fibers of the copoly-para-phenylene.3,4'-oxydiphenylene.terephthalamide, and having a breaking elongation of 13.2%, a breaking tenacity of 4.2 g/denier, a specific gravity of 1.355, a single fiber fineness of 2.5 denier, a fiber length of 5 mm, and an equilibrium water content of 4.1%, as undrawn or low ratio drawn para-aromatic polyamide staple fibers, and 5 percent by weight of fibrids (produced by TEIJIN LTD.) comprising copoly-para-phenylene.3,4'-oxydiphenylene.terephthalamide and having an equilibrium moisture content of 4.4% were disaggregated and dispersed in water by the use of a pulper, and a dispersant ([YM-80], produced by MATSUMOTO YUSHI LTD.) was added to the obtained dispersion in a concentration of 0.02% to make the slurry having a fiber concentration of 0.15 percent by weight and used for making paper sheet.

Subsequently, a paper sheet was made from said slurry for making the paper sheet with a TAPPI square sheet machine, lightly subjected to a pressurizing dehydration treatment and then dried in a 160° C. hot air drying machine for about 15 minutes to obtain the fiber paper sheet.

Further, the fiber paper sheet was heated and pressurized with a calender machine comprising a pair of hard surface metal rolls each having a diameter of about 400 mm in conditions of 200° C. and 160 kg/cm, and then again heated and pressurized with a high temperature high-calender machine comprising a pair of hard surface metal rolls each having a diameter of about 500 mm in conditions of 320° C. and 200 kg/cm to soften and/or partially melt the above-described undrawn or low ratio drawn staple fibers (single fiber fineness: 2.5 denier) comprising the copoly-para-phenylene.3,4'-oxydiphenylene.terephthalamide of para-aromatic polyamide and the fibrids comprising the copoly-para-phenylene.3,4'-oxydiphenylene.terephthalamide as binders, thus binding the copoly-para-phenylene.3,4'-oxydiphenylene.terephthalamide single fibers as the heat-resistant organic polymer staple fibers to each other to obtain the heat-resistant fiber paper sheet having a basis weight of 72 g/m².

Examples 2 to 8, Comparative Examples 1 to 2

A fiber paper sheet was obtained similarly to Example 1 except the employment of the copoly-para-phenylene.3,4'-oxydiphenylene.terephthalamide staple fibers (single fiber fineness: 1.5 denier) used in Example 1 as staple fibers comprising a heat-resistant organic polymer, except the employment of the copoly-para-phenylene.3,4'-oxydiphenylene.terephthalamide staple fibers (single fiber fineness: 2.5 denier) used in Example 1 as undrawn or low ratio drawn aromatic polyamide staple fibers, except the employment of the copoly-para-phenylene.3,4'-oxydiphenylene.terephthalamide fibrids used in Example 1 as fibrids, and except the changes of their mixing ratios as shown in Table 1.

Example 9

A fiber paper sheet was obtained similarly to Example 2 except the employment of the copoly-para-phenylene.3,4'-oxydiphenylene.terephthalamide staple fibers (single fiber fineness: 1.5 denier) used in Example 2 as staple fibers comprising a heat-resistant organic polymer, except the employment of staple fibers ([TECHNORA®], produced by TEIJIN LTD., draw ratio: 1.8) comprising copoly-para-phenylene.3,4'-oxydiphenylene.terephthalamide, produced by fixing 0.6 percent by weight of talc and 0.2 percent by weight of osmos to the surfaces of the staple fibers of the copoly-para-phenylene.3,4'-oxydiphenylene.terephthalamide, and having a breaking elongation of 5.8%, a breaking tenacity of 6.1 g/denier, a specific gravity of 1.377, a single fiber fineness of 2.5 denier, a fiber length of 5 mm, and an equilibrium water content of 3.8%, as undrawn or low ratio drawn para-aromatic polyamide staple fibers, except the employment of the copoly-para-phenylene.3,4'-oxydiphenylene.terephthalamide fibrids used in Example 2 as fibrids, and except the changes of their mixing ratios as shown in Table 1.

Comparative Example 3

A fiber paper sheet was obtained similarly to Example 1 except the employment of the same staple fibers and the same fibrids as those used in Example 1 as staple fibers comprising a heat-resistant organic polymer and as fibrids, except the perfect unemployment of undrawn or low ratio drawn aromatic polyamide staple fibers having a specific gravity of not more than 1.380, and except the change of their mixing ratio as shown in Table 1.

Comparative Example 4

A fiber paper sheet was obtained similarly to Comparative Example 3 except that a bisphenol A epichlorohydrin type water-dispersible epoxy resin binder having a solid content of 10 percent by weight (produced by DAINIPPON INK KOGYO LTD.) was imparted in a resin component content of 5 percent by weight by a spray method in stead of the fibrids without using the fibrids, in Comparative Example 3.

Comparative Example 5

A fiber paper sheet was obtained similarly to Comparative Example 3 except that the mixing ratio of the stable fibers comprising the heat-resistant organic polymer to the fibrids in Comparative Example 3 was changed as shown in Table 1.

Comparative Example 6

A fiber paper sheet was obtained similarly to Comparative Example 4 except that the mixing ratio of the stable fibers comprising the heat-resistant organic polymer to the water-dispersible epoxy resin binder in Comparative Example 4 was changed as shown in Table 1.

Example 10

A fiber paper sheet was obtained similarly to Example 2 except that fibrids (produced by KORON LTD.) comprising poly-para-phenylene terephthalamide and having an equilibrium moisture content of 5.4% were used in stead of the fibrids comprising the copoly-para-phenylene.3,4'-oxydiphenylene.terephthalamide in Example 2.

Example 11

A fiber paper sheet was obtained similarly to Example 2 except that staple fibers ([KEVLAR], produced by DU PONT LTD.) obtained by thermally treating fibers comprising poly-para-phenylene terephthalamide in a high temperature atmosphere of 400° C. and having a single fiber fineness of 1.42 denier, a specific gravity of 1.463, a fiber length of 3 mm and an equilibrium moisture content of 1.7% were used in stead of the copoly-para-phenylene.3,4'-oxydiphenylene.terephthalamide staple fibers used as the staple fibers comprising the heat-resistant organic polymer in Example 2.

Example 12

A fiber paper sheet was obtained similarly to Example 11 except that 10 percent by weight of poly-para-phenylene terephthalamide fibrids (KORON LTD.) having an equilibrium moisture content 5.4% was used.

Example 13

A fiber paper sheet was obtained similarly to Example 2 except that the mixing ratio of the copoly-para-phenylene.3,4-oxydiphenylene.terephthalamide fibrids in Example 2 was changed to 5 percent by weight and further except that a water-dispersible epoxy resin binder having a solid content of 10 percent by weight (produced by DAINIPPON INK KAGAKU KOGYO LTD.) was imparted by a spray method so that the content of said resin becomes 5 percent by weight.

Examples 14 to 21, Comparative Examples 7 to 10

A fiber paper sheet was obtained similarly to Example 2 except that the heating and pressurizing conditions with the high-calender machine in Example 2 were changed as shown in Table 1.

Examples 22 to 25

A fiber paper sheet was obtained similarly to Example 2 except that the fiber length of the copoly-para-phenylene.3,4'-oxydiphenylene.terephthalamide staple fibers used as the staple fibers comprising the heat-resistant organic polymer in Example 2 was changed as shown in Table 1.

Example 26

A heat-resistant fiber paper sheet was obtained similarly to Example 2 except that 59 percent by weight of copoly-para-phenylene.3,4'-oxydiphenylene.terephthalamide staple fibers ([TECHNORA®], produced by TEIJIN LTD.) and 20 percent by weight of poly-para-phenylenebenzobisoxazole staple fibers (produced by TOYOBO LTD.) were used as the heat-resistant organic polymer staple fibers in Example 2.

Example 27

A heat-resistant fiber paper sheet was obtained similarly to Example 2 except that 69 percent by weight of copoly-para-phenylene.3,4'-oxydiphenylene.terephthalamide staple fibers ([TECHNORA®], produced by TEIJIN LTD.) and 10 percent by weight of polyester ether ketone staple fibers (produced by TEIJIN LTD.) were used as the heat-resistant organic polymer staple fibers in Example 2.

Example 28

A heat-resistant fiber paper sheet was obtained similarly to Example 2 except that 69 percent by weight of copoly-para-phenylene.3,4'-oxydiphenylene.terephthalamide staple fibers ([TECHNORA®], produced by TEIJIN LTD.) and 10 percent by weight of melt liquid crystalline wholly aromatic polyester staple fibers ([VECTRAN®], produced by KURARAY LTD.) were used as the heat-resistant organic polymer staple fibers in Example 2.

Example 29

A heat-resistant fiber paper sheet was obtained similarly to Example 2 except that 8 percent by weight of the copoly-para-phenylene.3,4'-oxydiphenylene.terephthalamide staple fibers ([TECHNORA®], produced by TEIJIN LTD.) used in Example 2 and 3 percent by weight of poly-meta-phenylene isophthalamide staple fibers ([CONEX®], produced by TEIJIN LTD.) having a single fiber fineness of 3.0 denier and a fiber length of 5 mm were together used as the undrawn or low ratio drawn aromatic polyamide staple fibers in Example 2.

Example 30

A heat-resistant fiber paper sheet was obtained similarly to Example 29 except that polyether ether ketone staple fibers (produced by TEIJIN LTD.) were used in stead of the poly-meta-phenylene isophthalamide in Example 29.

Example 31

A heat-resistant fiber paper sheet was obtained similarly to Example 2 except that poly-meta-phenylene isophthalamide fibrids having an equilibrium moisture content of 7.2% were used instead of the copoly-para-phenylene.3,4'-oxydiphenylene.terephthalamide fibrids in Example 2.

Example 32

A heat-resistant fiber paper sheet was obtained similarly to Example 2 except that melt liquid-crystalline aromatic polyester fibrids (([VECTRAN®], produced by KURARAY LTD.) having an equilibrium moisture content of about 0.05% were used instead of the copoly-para-phenylene.3,4'-oxydiphenylene.terephthalamide fibrids in Example 2.

Example 33

A heat-resistant fiber paper sheet was obtained similarly to Example 2 except that poly-para-phenylenebenzobisoxazole fibrids having an equilibrium moisture content of 4.0% were used instead of the copoly-para-phenylene.3,4'-oxydiphonylene.terephthalamide fibrids in Example 2.

Example 34

A heat-resistant fiber paper sheet was obtained similarly to Example 2 except that 3 percent by weight of poly-para-phenylene terephthalamide fibrids ([KEVLAR®], produced by DU PONT LTD.) and 7 percent by weight of poly-para-phenylene terephthalamide fibrids (produced by KORON LTD.) having an equilibrium moisture content of 5.4% were used instead of the copoly-para-phenylene.3,4'-oxydiphenylene.terephthalamide fibrids in Example 2.

Example 35

A heat-resistant fiber paper sheet was obtained similarly to Example 3 except that a bisphenol A epichlorohydrin type water-dispersible epoxy resin binder (produced by DAINIPPON INK KAGAKU KOGYO LTD.) having a solid content of 10 percent by weight was imparted by a spray method in a resin content of 15 percent by weight without using the copoly-para-phenylene.3,4'-oxydiphenylene.terephthalamide fibrids in Example 3.

The heat-resistant fiber paper sheet production conditions shown in each Example and each Comparative Example described above are shown in Table 1, and various characteristics evaluated by the above-described measurement methods are shown in Table 2. Therein, A in A/B in Table 1 represents the heat-resistant organic polymer staple fibers, and B also represents the undrawn or low ratio drawn para-aromatic polyamide staple fibers.

Further, a deformation quantity and an insulative resistance value under a high humidity were measured on each laminate which was used for an electric circuit board and formed by impregnating said fiber sheet with a mixed varnish by the method described in the above-described measuring method to form the prepreg, and then using the prepreg. The measurement results are shown in Table 2.

TABLE 1

| #-b | Mixing ratio (%) A/B | Binder component Fibrid/other | Staple fibers Cut length (mm) A/B | High-calender conditions (Final calendering conditions) Heating temperature (° C.) | Linear pressure (kg/cm) |
|---|---|---|---|---|---|
| #-a1 | 86/12 | 2/0 | 3/5 | 320 | 200 |
| Example 1 | 83/12 | 5/0 | 3/5 | 320 | 200 |
| Example 2 | 79/11 | 10/0 | 3/5 | 320 | 200 |
| Example 3 | 75/10 | 15/0 | 3/5 | 320 | 200 |
| Example 4 | 66/9 | 25/0 | 3/5 | 320 | 200 |
| Example 5 | 57/8 | 35/0 | 3/5 | 320 | 200 |
| Example 6 | 44/6 | 50/0 | 3/5 | 320 | 200 |
| #-a2 | 35/5 | 60/0 | 3/5 | 320 | 200 |
| #-a3 | 95/0 | 5/0 | 3/5 | 320 | 200 |
| #-a4 | 95/0 | 0/5 | 3/5 | 320 | 200 |
| #-a5 | 50/0 | 50/0 | 3/5 | 320 | 200 |
| #-a6 | 50/0 | 0/50 | 3/5 | 320 | 200 |
| Example 7 | 85/5 | 10/0 | 3/5 | 320 | 200 |
| Example 8 | 72/18 | 10/0 | 3/5 | 320 | 200 |
| Example 9 | 63/27 | 10/0 | 3/5 | 320 | 200 |
| Example 10 | 79/11 | 10/0 | 3/5 | 320 | 200 |
| Example 11 | 79/11 | 10/0 | 3/5 | 320 | 200 |
| Example 12 | 79/11 | 10/0 | 3/5 | 320 | 200 |
| Example 13 | 79/11 | 5/5 | 3/5 | 320 | 200 |
| #-a7 | 79/11 | 10/0 | 3/5 | 200 | 200 |
| Example 14 | 79/11 | 10/0 | 3/5 | 220 | 200 |
| Example 15 | 79/11 | 10/0 | 3/5 | 280 | 200 |
| Example 16 | 79/11 | 10/0 | 3/5 | 340 | 200 |
| Example 17 | 79/11 | 10/0 | 3/5 | 380 | 200 |
| #-a8 | 79/11 | 10/0 | 3/5 | 420 | 200 |
| #-a9 | 79/11 | 10/0 | 3/5 | 320 | 130 |
| Example 18 | 79/11 | 10/0 | 3/5 | 320 | 160 |
| Example 19 | 79/11 | 10/0 | 3/5 | 320 | 180 |
| Example 20 | 79/11 | 10/0 | 3/5 | 320 | 220 |
| Example 21 | 79/11 | 10/0 | 3/5 | 320 | 240 |
| #-a10 | 79/11 | 10/0 | 3/5 | 320 | 280 |
| Example 22 | 79/11 | 10/0 | 1.2/5 | 320 | 200 |
| Example 23 | 79/11 | 10/0 | 5/6 | 320 | 200 |
| Example 24 | 79/11 | 10/0 | 8/5 | 320 | 200 |
| Example 25 | 79/11 | 10/0 | 13/5 | 320 | 200 |
| Example 26 | 79/11 | 10/0 | 3/5 | 320 | 200 |
| Example 27 | 79/11 | 10/0 | 3/5 | 320 | 200 |
| Example 28 | 79/11 | 10/0 | 3/5 | 320 | 200 |
| Example 29 | 79/11 | 10/0 | 3/5 | 320 | 200 |
| Example 30 | 79/11 | 10/0 | 3/5 | 320 | 200 |
| Example 31 | 79/11 | 10/0 | 3/5 | 320 | 200 |
| Example 32 | 79/11 | 10/0 | 3/5 | 320 | 200 |
| Example 33 | 79/11 | 10/0 | 3/5 | 320 | 200 |
| Example 34 | 79/11 | 10/0 | 3/5 | 320 | 200 |
| Example 35 | 79/11 | 0/15 | 3/5 | 320 | 200 |

-a: Comparative Example
-b: Staple fiber classification

TABLE 2

| | Characteristics of heat-resistant fiber paper sheet | | | | | | Laminate for electric circuit board | |
|---|---|---|---|---|---|---|---|---|
| | Bulk density g/cm$^3$ | Tensile strength kg/15 mm | Plybond strength g/15 mm | #-b % | #-c % | #-d μm | #-e mm | #-f Ω/cm |
| #-a1 | 0.38 | 1.3 | 11.0 | 0.29 | 2.02 | 68 | 3.2 | 10$^9$ |
| Example 1 | 0.55 | 3.4 | 30.7 | 0.06 | 2.09 | 33 | 2.5 | 10$^{12}$ |
| Example 2 | 0.64 | 4.6 | 31.2 | 0.02 | 2.19 | 16 | 1.7 | 10$^{12}$ |
| Example 3 | 0.70 | 5.4 | 35.8 | 0.02 | 2.30 | 12 | 1.3 | 10$^{12}$ |
| Example 4 | 0.74 | 5.9 | 43.1 | 0.12 | 2.53 | 39 | 2.3 | 10$^{11}$ |
| Example 5 | 0.85 | 6.3 | 45.4 | 0.19 | 2.75 | 48 | 2.6 | 10$^{10}$ |
| Example 6 | 1.02 | 7.6 | 69.3 | 0.27 | 2.99 | 61 | 3.1 | 10$^9$ |

TABLE 2-continued

| | Characteristics of heat-resistant fiber paper sheet | | | | | | Laminate for electric circuit board | |
|---|---|---|---|---|---|---|---|---|
| | Bulk den-sity g/cm³ | Tensile strength kg/15 mm | Plybond strength g/15 mm | #-b % | #-c % | #-d μm | #-e mm | #-f Ω/cm |
| #-a2 | 1.18 | 8.3 | 62.6 | 0.38 | 2.31 | 77 | 4.6 | $10^8$ |
| #-a3 | 0.42 | 1.4 | 20.2 | 0.21 | 2.77 | 59 | 2.9 | $10^{11}$ |
| #-a4 | 0.40 | 1.1 | 9.5 | 0.33 | 2.03 | 69 | 4.2 | $10^{12}$ |
| #-a5 | 1.11 | 7.8 | 60.4 | 0.36 | 2.95 | 72 | 4.5 | $10^9$ |
| #-a6 | 0.92 | 8.1 | 62.2 | 0.32 | 2.84 | 76 | 3.1 | $10^{11}$ |
| Example 7 | 0.58 | 3.8 | 27.6 | 0.09 | 2.07 | 23 | 1.9 | $10^{12}$ |
| Example 8 | 0.66 | 4.4 | 33.2 | 0.02 | 2.35 | 10 | 1.1 | $10^{12}$ |
| Example 9 | 0.74 | 5.3 | 36.4 | 0.04 | 2.55 | 7 | 1.0 | $10^{11}$ |
| Example 10 | 0.51 | 3.8 | 29.9 | 0.04 | 2.23 | 13 | 1.3 | $10^{12}$ |
| Example 11 | 0.66 | 4.8 | 31.6 | 0.01 | 2.12 | 9 | 1.2 | $10^{12}$ |
| Example 12 | 0.61 | 4.2 | 30.9 | 0.21 | 2.15 | 8 | 1.1 | $10^{12}$ |
| Example 13 | 0.63 | 4.4 | 31.1 | 0.03 | 2.16 | 14 | 1.8 | $10^{12}$ |
| #-a7 | 0.42 | 1.8 | 13.2 | 0.27 | 2.23 | 69 | 3.1 | $10^{11}$ |
| Example 14 | 0.50 | 3.6 | 18.6 | 0.23 | 2.21 | 62 | 2.8 | $10^{11}$ |
| Example 15 | 0.53 | 3.8 | 31.0 | 0.02 | 2.21 | 17 | 1.8 | $10^{12}$ |
| Example 16 | 0.72 | 5.7 | 42.2 | 0.02 | 2.18 | 13 | 1.5 | $10^{12}$ |
| Example 17 | 0.86 | 7.7 | 55.4 | 0.04 | 2.14 | 11 | 1.3 | $10^{12}$ |
| #-a8 | 1.21 | 3.9 | 64.3 | 0.41 | 2.16 | 77 | 4.8 | $10^{11}$ |
| #-a9 | 0.43 | 2.4 | 16.7 | 0.23 | 2.21 | 67 | 3.3 | $10^{11}$ |
| Example 18 | 0.52 | 3.9 | 20.2 | 0.18 | 2.20 | 55 | 2.3 | $10^{12}$ |
| Example 19 | 0.58 | 4.2 | 20.6 | 0.13 | 2.19 | 48 | 2.0 | $10^{12}$ |
| Example 20 | 0.67 | 5.2 | 31.8 | 0.02 | 2.16 | 44 | 3.5 | $10^{12}$ |
| Example 21 | 0.81 | 6.5 | 50.2 | 0.14 | 2.14 | 12 | 1.8 | $10^{12}$ |
| #-a10 | 1.15 | 7.9 | 61.1 | 0.37 | 2.68 | 48 | 4.1 | $10^{11}$ |
| Example 22 | 0.60 | 3.9 | 29.6 | 0.05 | 2.20 | 19 | 1.9 | $10^{12}$ |
| Example 23 | 0.66 | 4.9 | 31.7 | 0.08 | 2.21 | 24 | 2.1 | $10^{12}$ |
| Example 24 | 0.69 | 5.2 | 32.4 | 0.12 | 2.20 | 36 | 2.6 | $10^{12}$ |
| Example 25 | 0.66 | 5.9 | 38.2 | 0.24 | 2.21 | 56 | 3.6 | $10^{12}$ |
| Example 26 | 0.63 | 4.4 | 31.1 | 0.01 | 2.14 | 9 | 1.1 | $10^{12}$ |
| Example 27 | 0.66 | 4.8 | 31.7 | 0.05 | 2.16 | 26 | 1.9 | $10^{11}$ |
| Example 28 | 0.61 | 4.3 | 31.2 | 0.08 | 2.13 | 48 | 2.7 | $10^{11}$ |
| Example 29 | 0.62 | 4.4 | 30.9 | 0.07 | 2.22 | 21 | 2.2 | $10^{11}$ |
| Example 30 | 0.64 | 4.7 | 31.5 | 0.08 | 2.20 | 26 | 2.7 | $10^{12}$ |
| Example 31 | 0.53 | 3.9 | 29.7 | 0.09 | 2.59 | 38 | 2.4 | $10^{11}$ |
| Example 32 | 0.58 | 4.2 | 30.1 | 0.02 | 1.89 | 13 | 1.4 | $10^{12}$ |
| Example 33 | 0.60 | 4.4 | 30.4 | 0.01 | 2.00 | 10 | 1.1 | $10^{12}$ |
| Example 34 | 0.59 | 3.9 | 29.7 | 0.01 | 2.23 | 13 | 1.2 | $10^{11}$ |
| Example 35 | 0.67 | 5.1 | 34.7 | 0.02 | 2.26 | 11 | 1.5 | $10^{12}$ |

-a: Comparative Example
-b: Heat dimensional change
-c: Equilibrium moisture content
-d: Moisture absorption-desorption dimensional change
-e: Deformation quantity
-f: Insulative resistance

UTILIZATION IN INDUSTRY

The aromatic fiber paper sheet of the present invention is a heat-resistant fiber paper sheet which can solve various problems on the employment of heat-resistant fiber paper sheets made by conventional techniques for laminates for electric circuit boards, can especially reduce dimensional changes caused by changes in temperature and moisture, can lower water absorption coefficients (equilibrium moisture contents) to improve electrically insulating properties, and has a high tensile strength and a high plybond strength. A laminate which is used for an electric circuit board and uses said heat-resistant fiber paper sheet as a substrate is an epoch-making laminate which scarcely causes torsion, curvature, waving and the like in a process for producing the laminate and on the uses of the laminate, thereby enables the designing of microcircuits, and can maintain high reliability over a long period, even when an electronic part having a small temperature-humidity expansion coefficient, such as a leadless ceramic chip carrier (LCCC) or a bare chip, is directly loaded on the laminate. In particular, the heat-resistant fiber paper sheet of the present invention is suitable as the substrate of a laminate for an electric circuit board in uses requiring a highly lightweight property, high heat-resistant, moisture-resistant dimensional stability and a high electric insulating property.

What is claimed is:

1. A heart-resistant fiber paper sheet comprising staple fibers of a heat-resistant organic polymer, undrawn or low ratio drawn para-aromatic polyamide staple fibers having a specific gravity of not more than 1.380 and a breaking elongation of not more than 5.8%, and fibrids comprising a heat-resistant organic polymer as a main component, optionally in combination with an organic resin binder, characterized in that
    the amount of said staple fibers is 45 to 97 percent by weight based on the total amount of said heat-resistant fiber paper sheet;
    the amount of said fibrids is 3 to 55 percent by weight based on the total amount of said heat-resistant fiber paper sheet; and
    said fibrids comprising said organic polymer, and/or the staple fibers comprising said para-aromatic polyamide are partially softened and/or melted to exhibit the actions of binders.

2. The heat-resistant fiber paper sheet according to claim 1, wherein the undrawn or low ratio drawn para-aromatic polyamide staple fibers have a breaking tenacity of not more than 17.5 g/denier.

3. The heat-resistant fiber paper sheet according to claim 1, wherein the specific gravity of the undrawn or low ratio drawn para-aromatic polyamide staple fibers is not more than 1.375.

4. The heat-resistant fiber paper sheet according to claim 1, wherein the staple fibers comprising the heat-resistant organic polymer are aromatic polyamide staple fibers.

5. The heat-resistant fiber paper sheet according to claim 4, wherein the aromatic polyamide staple fibers which are the staple fibers comprising the heat-resistant organic polymer are para-aromatic polyamide staple fibers.

6. The heat-resistant fiber paper sheet according to claim 5, wherein the para-aromatic polyamide staple fibers are staple fibers comprising poly-para-phenylene terephthalamide and/or staple fibers comprising copoly-para-phenylene.3,4'-oxydiphenylene.terephthalamide.

7. The heat-resistant fiber paper sheet according to claim 6, wherein the staple fibers comprising the copoly-para-phenylene.3,4'-oxydiphenylene.terphthalamide are staple fibers to whose surfaces a solid, cation-converting, and ion-non-adsorbing inorganic compound is fixed.

8. The heat-resistant fiber paper sheet according to claim 4, wherein the amount of undrawn or low ratio drawn para-aromatic polyamide staple fibers is 4 to 35 percent by weight, based on the total amount of aromatic polyamide staple fibers.

9. The heat-resistant fiber paper sheet according to claim 1, wherein the undrawn or low ratio drawn para-aromatic polyamide staple fibers are staple fibers comprising poly-para-phenylene terephthalamide and/or staple fibers comprising copoly-para-phenylene.3,4'-oxydiphenylene.terephthalamide.

10. The heat-resistant fiber paper sheet according to claim 9, wherein the staple fibers comprising the copoly-para-phenylene.3,4'-oxydiphenylene.terephthalamide are the staple fibers to whose surfaces a solid, cation-converting, and ion-non-adsorbing inorganic compound is fixed.

11. The heat-resistant fiber paper sheet according to claim 1, wherein the organic resin binder is the water-dispersible binder of one or more resins selected from the group consisting of epoxy resins, phenolic resins, melamine-based resins, and fluoropolymer resins.

12. The heat-resistant fiber paper sheet according to claim 1, wherein the staple fibers comprising the heat-resistant organic polymer are staple fibers comprising a heterogeneous ring-containing aromatic polymer.

13. The heat-resistant fiber paper sheet according to claim 1, 2, 3, 9, 10 or 11, wherein the staple fibers comprising the heat-resistant organic polymer are staple fibers comprising a polyether ketone.

14. The heat-resistant fiber paper sheet according to claim 1, wherein the fiber length of the staple fibers comprising the heat-resistant organic polymer are ranged from 2 to 12 mm.

15. The heat-resistant fiber paper sheet according to claim 1, wherein a difference of not less than 0.6 mm exists between the fiber length of the staple fibers comprising the heat-resistant organic polymer and the fiber length of the undrawn or low ratio drawn para-aromatic polyamide staple fibers.

16. The heat resistant fiber paper sheet according to claim 1, wherein the fibrids comprising the heat-resistant organic polymer have an equilibrium moisture content of not more than 7.5%.

17. The heat-resistant fiber paper sheet according to claim 16, wherein the fibrids comprising the heat-resistant organic polymer are fibrids comprising polypara-phenylene terephthalamide and/or copoly-para-phenylene.3,4'-oxydiphenylene.terephthalamide.

18. The heat-resistant fiber paper sheet according to claim 16, wherein the fibrids comprising the heat-resistant organic polymer are fibrids comprising poly-meta-phenylene terephthalamide.

19. The heat-resistant fiber paper sheet according to claim 16, wherein the fibrids comprising the heat-resistant organic polymer are fibrids comprising a melt liquid crystalline wholly aromatic polyester.

20. The heat-resistant fiber paper sheet according to claim 16, wherein the fibrids comprising the heat-resistant organic polymer are fibrids comprising a heterogeneous ring-containing aromatic polymer.

21. The heat-resistant fiber paper sheet according to claim 1, wherein the bulk density of the heat-resistant fiber paper sheet is 0.45 to 1.13 g/cm$^3$.

22. The heat-resistant fiber paper sheet according to claim 1, wherein the maximum quantity of paper dimensional change of a paper with a length of 20 mm and a width of 5 mm is not more than 65 $\mu$m when the measured by keeping the heat-resistant fiber paper sheet in an atmosphere having not less than 85% RH at room temperature for not less than 48 hours to sufficiently absorb moisture is heated from the room temperature to 280° C. at a temperature-rising rate of 10° C./min, immediately cooling the heat-resistant fiber paper sheet to room temperature at a temperature-lowering rate of 10° C./min to dry the fiber paper sheet, twice repeating said heating treatment and cooling treatment and subsequently measuring the maximum quantity of dimensional change of said paper sheet in the longitudinal direction.

23. The heat-resistant fiber paper sheet according to claim 1, wherein the rate of dimensional change of the fiber paper sheet in the longitudinal direction is not more than 0.30%, when the fiber paper sheet is thermally treated at a temperature of 280° C. for five minutes.

24. The heat-resistant fiber paper sheet according to claim 1, wherein the tensile strength and plybond strength of the fiber paper sheet are not less than 1.5 kg/15 mm and not less than 12 g/15 mm, respectively.

25. A method for producing a heat-resistant fiber paper sheet, characterized by subjecting staple fibers comprising a heat-resistant organic polymer, undrawn or low ratio drawn para-aromatic polyamide staple fibers having a specific gravity of not more than 1.380 and a breaking elongation of not more than 5.8%, and fibrids comprising a heat-resistant organic polymer, optionally in combination with an organic resin binder to a wet paper-making process, drying the obtained wet paper sheet, and then heating and pressurizing the obtained dry paper sheet at a temperature of 220 to 400° C. at a pressure of 150 to 250 kg/cm to partially soften and/or melt the fibrids comprising said heat-resistant organic polymer.

26. The method for producing the heat-resistant fiber paper sheet according to claim 25, wherein an organic resin binder is imparted to said wet paper sheet obtained by the wet paper-making process.

27. The method for producing the heat-resistant fiber paper sheet according to claim 25, wherein the undrawn or low ratio drawn para-aromatic polyamide staple fibers having a specific gravity of not more than 1.380 has a breaking elongation of not less than 5.3% and a breaking tenacity of not more than 17.5 g/denier.

28. The method for producing the heat-resistant fiber paper sheet according to claim 25, wherein the staple fibers comprising the heat-resistant organic polymer are aromatic polyamide staple fibers.

29. The method for producing the heat-resistant fiber paper sheet according to claim 28, wherein the aromatic polyamide staple fibers are para-aromatic polyamide staple fibers.

30. The method for producing the heat-resistant fiber paper sheet according to claim 28, wherein the undrawn or low ratio drawn para-aromatic polyamide staple fibers having a specific gravity of not more than 1.380 and a breaking elongation of not more than 5.8%, and the aromatic polyamide staple fibers except said para-aromatic polyamide fibers are used in amounts of 4 to 35 percent by weight and 65 to 96 percent by weight, respectively, based on the total amount of the aromatic polyamide staple fibers.

31. The method for producing the heat-resistant fiber paper sheet according to claim 25, wherein the undrawn or low ratio drawn para-aromatic polyamide staple fibers having a specific gravity of not more than 1.380 are staple fibers comprising poly-para-phenylene terephthalamide and/or staple fibers comprising copoly-para-phenylene.3,4'-oxydiphenylene.terephthalamide.

32. A prepreg formed by impregnating a heat-resistant fiber paper sheet with a thermosetting resin, wherein said heat-resistant fiber paper sheet is the heat-resistant fiber paper sheet according to claim 1.

33. A laminate formed by heating and press-molding a heat-resistant fiber paper sheet impregnated with a thermosetting resin, wherein said heat-resistant fiber paper sheet is the resistant fiber paper sheet according to claim 1.

* * * * *